United States Patent [19]

Staudte

[11] Patent Number: 5,376,221
[45] Date of Patent: Dec. 27, 1994

[54] PROCESS FOR MASS PRODUCING HIGH FREQUENCY CRYSTAL RESONATORS

[76] Inventor: Juergen H. Staudte, 587 Rose Hill Rd., Cedar City, Utah 84720

[21] Appl. No.: 973,820

[22] Filed: Nov. 6, 1992

[51] Int. Cl.⁵ .................. B44C 1/22; C03C 15/00; C03C 25/06; C23F 1/00
[52] U.S. Cl. .................. 156/626; 156/633; 156/634; 156/645; 156/651; 156/656; 156/657; 156/663
[58] Field of Search ............ 156/626, 627, 630, 633, 156/634, 645, 647, 651, 656, 657, 659.1, 663; 331/68, 108 R, 116 R, 158, 187; 29/25.35; 310/348

[56] References Cited

U.S. PATENT DOCUMENTS

| | | | |
|---|---|---|---|
| 4,701,987 | 10/1987 | Studer | 156/651 X |
| 4,783,237 | 11/1988 | Aine et al. | 156/647 X |
| 4,916,413 | 4/1990 | Nakayama et al. | 331/68 |
| 5,008,817 | 3/1991 | Aine | 156/633 |

Primary Examiner—William A. Powell

[57] ABSTRACT

A process for making a plurality of quartz thickness shear resonators with resonating means for use in high frequency oscillators with operating frequencies of 30 MHz or greater. The invention includes grinding a single crystal quartz wafer to achieve a highly uniform thickness, thus enhancing uniformity of the resonators produced. The invention also includes etching the quartz wafer to form a plurality of resonators, each having a support structure and a much thinner etched resonating membrane cantilevered at the support structure. In addition, the design of the support structure is such that a sloped edge occurs during membrane etching between the support structure and the membrane, thus facilitating the application of electrodes extending from the support structure to the membrane. Yet another aspect of the invention is to perform a fine-tune etching during the formation and tuning of the resonating membranes, thus further enhancing the uniformity of the resonator frequencies across the wafer.

26 Claims, 6 Drawing Sheets

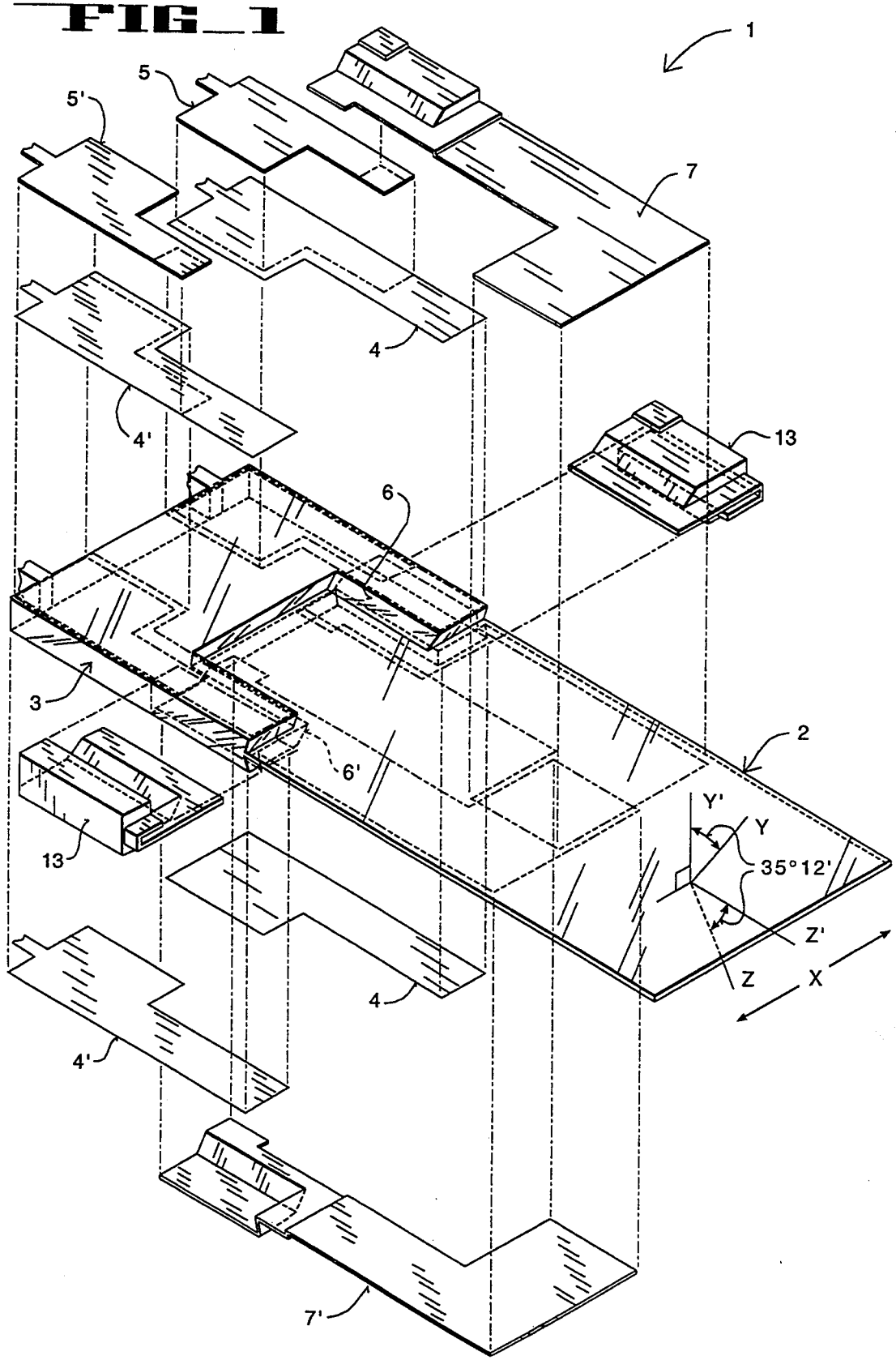

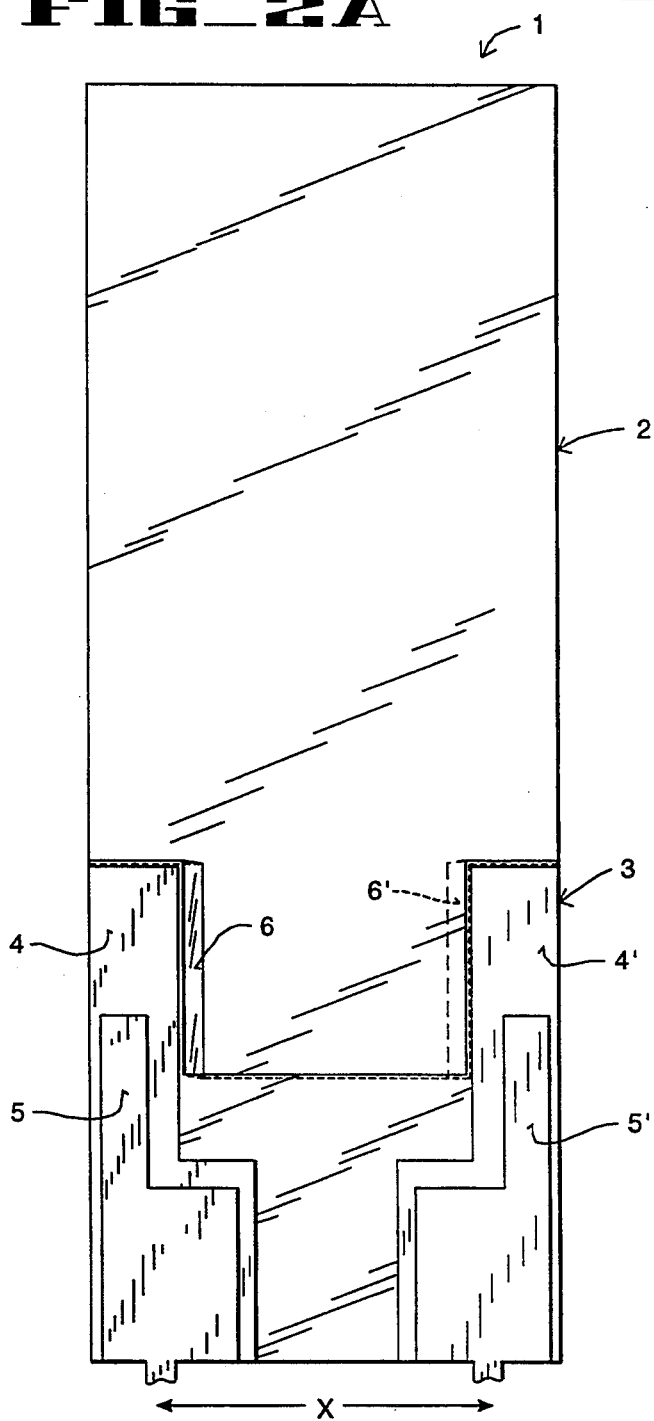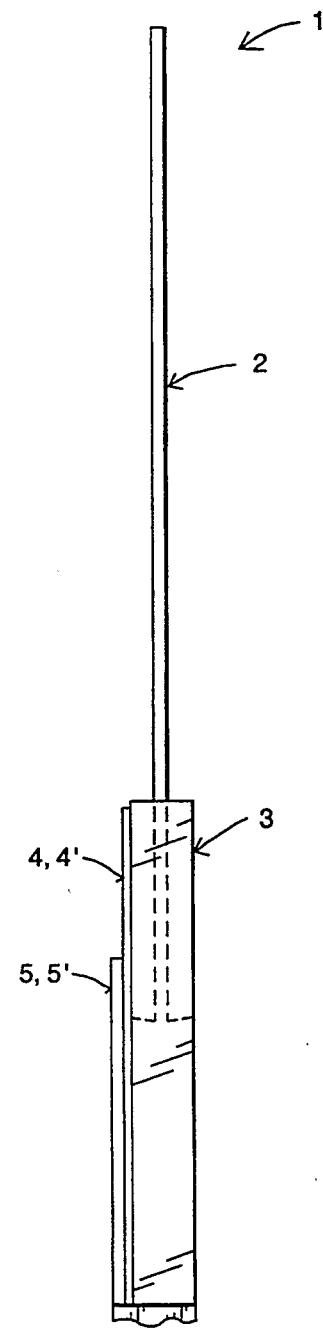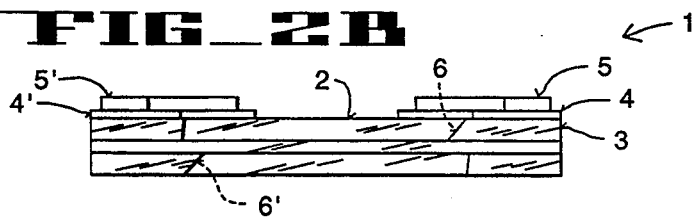

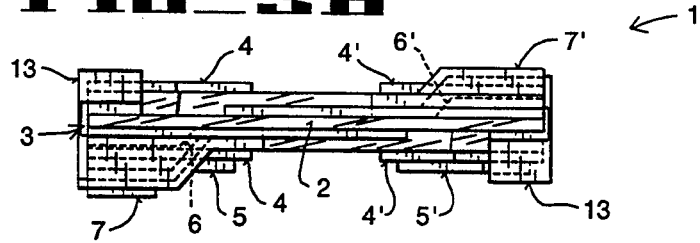
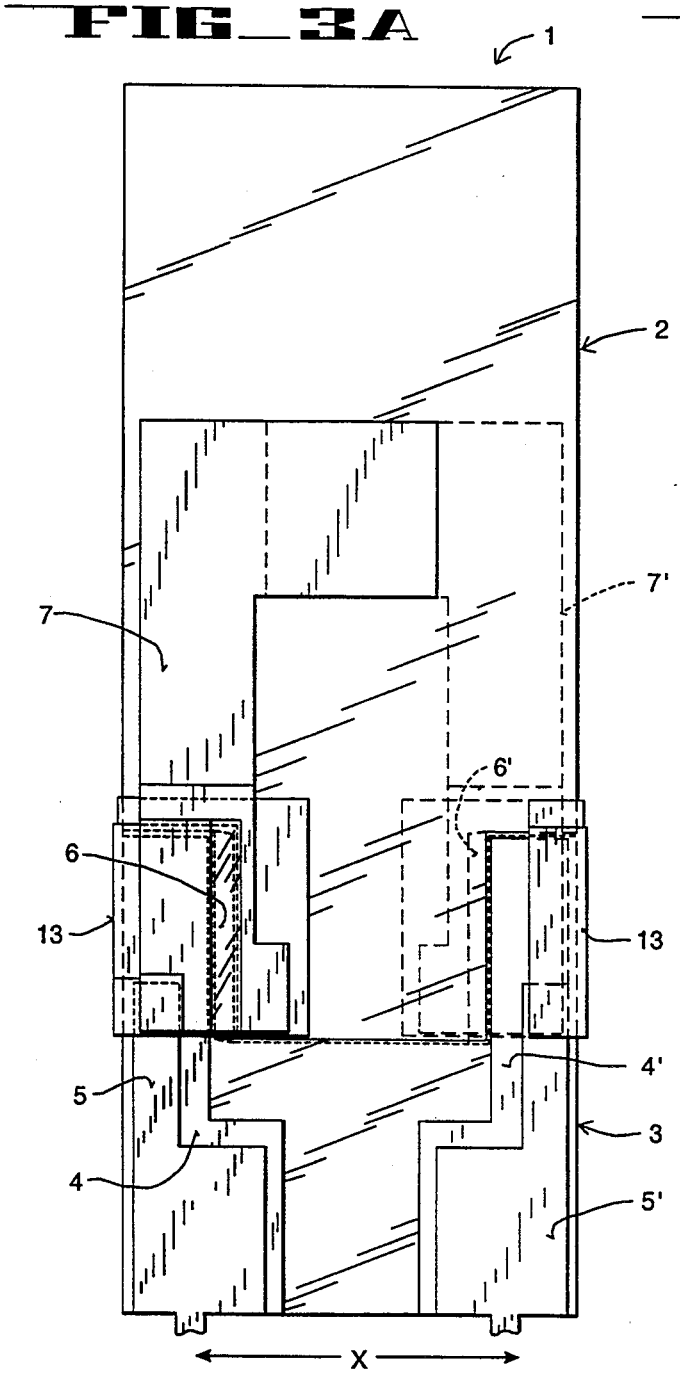
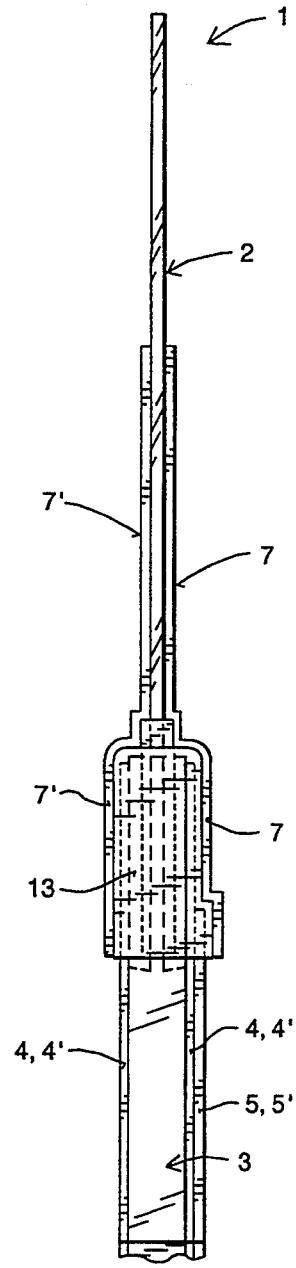

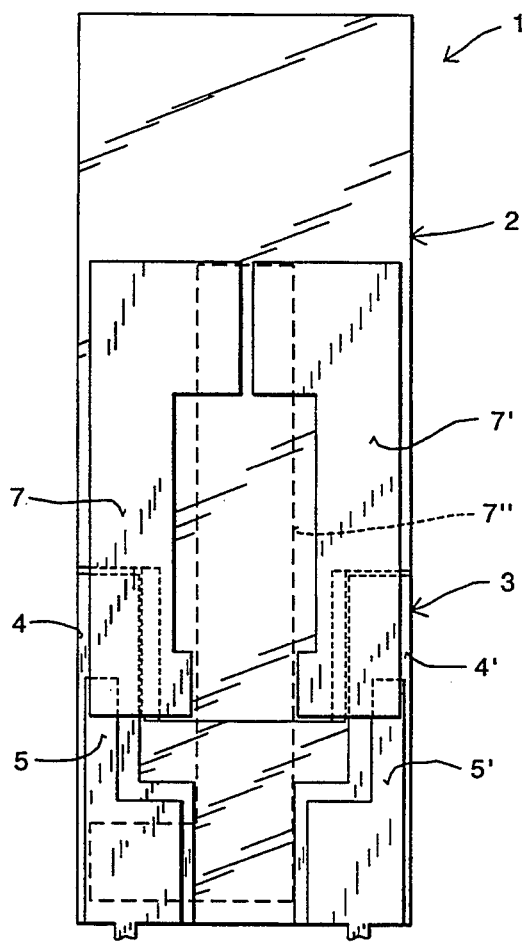
FIG_4
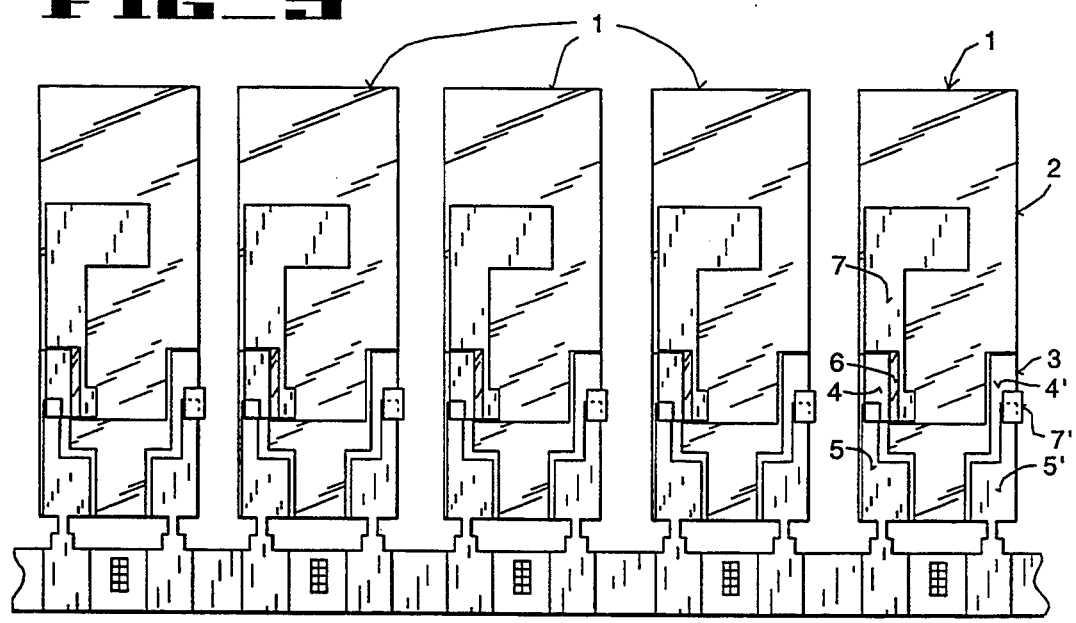
FIG_5

FIG_6
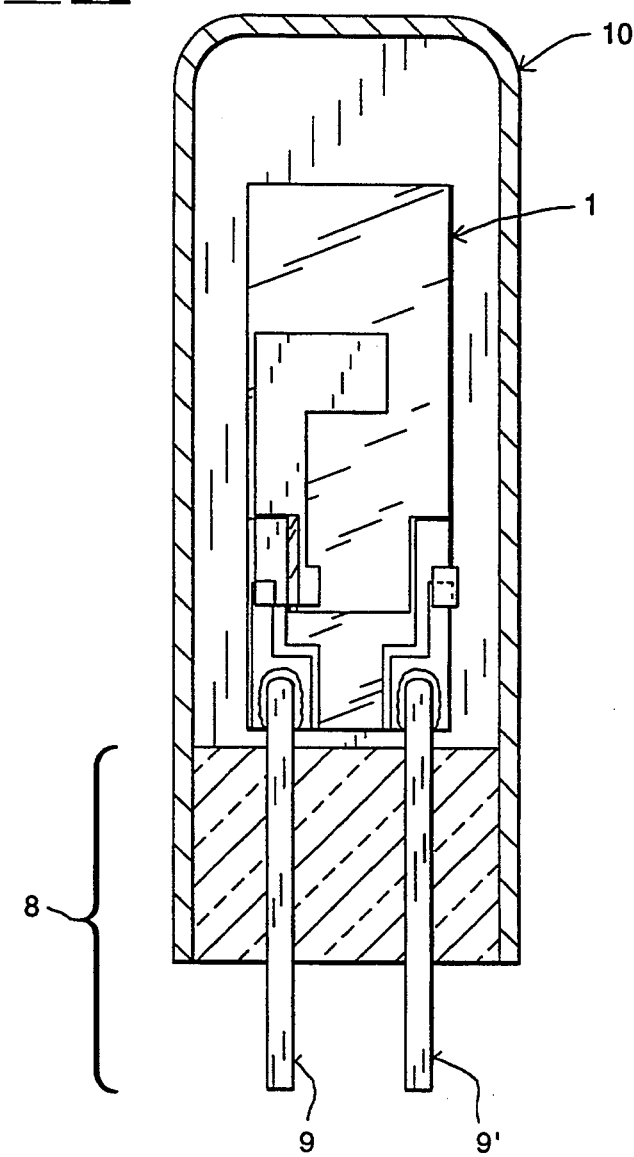
FIG_7
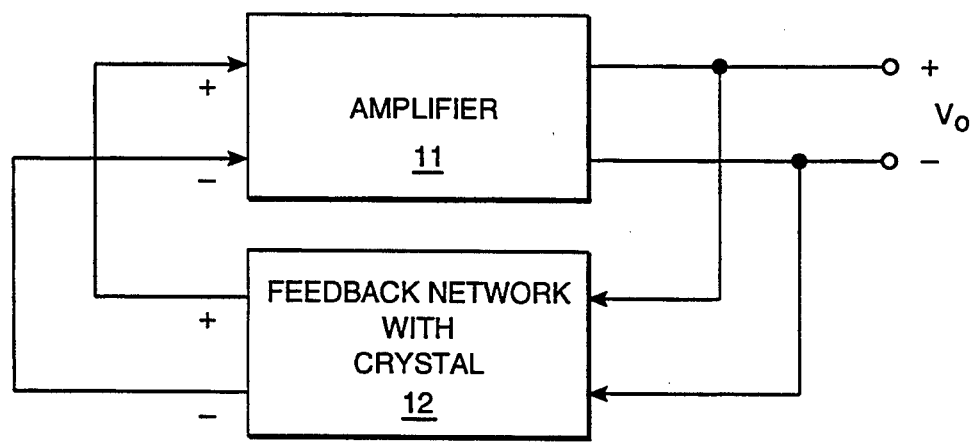

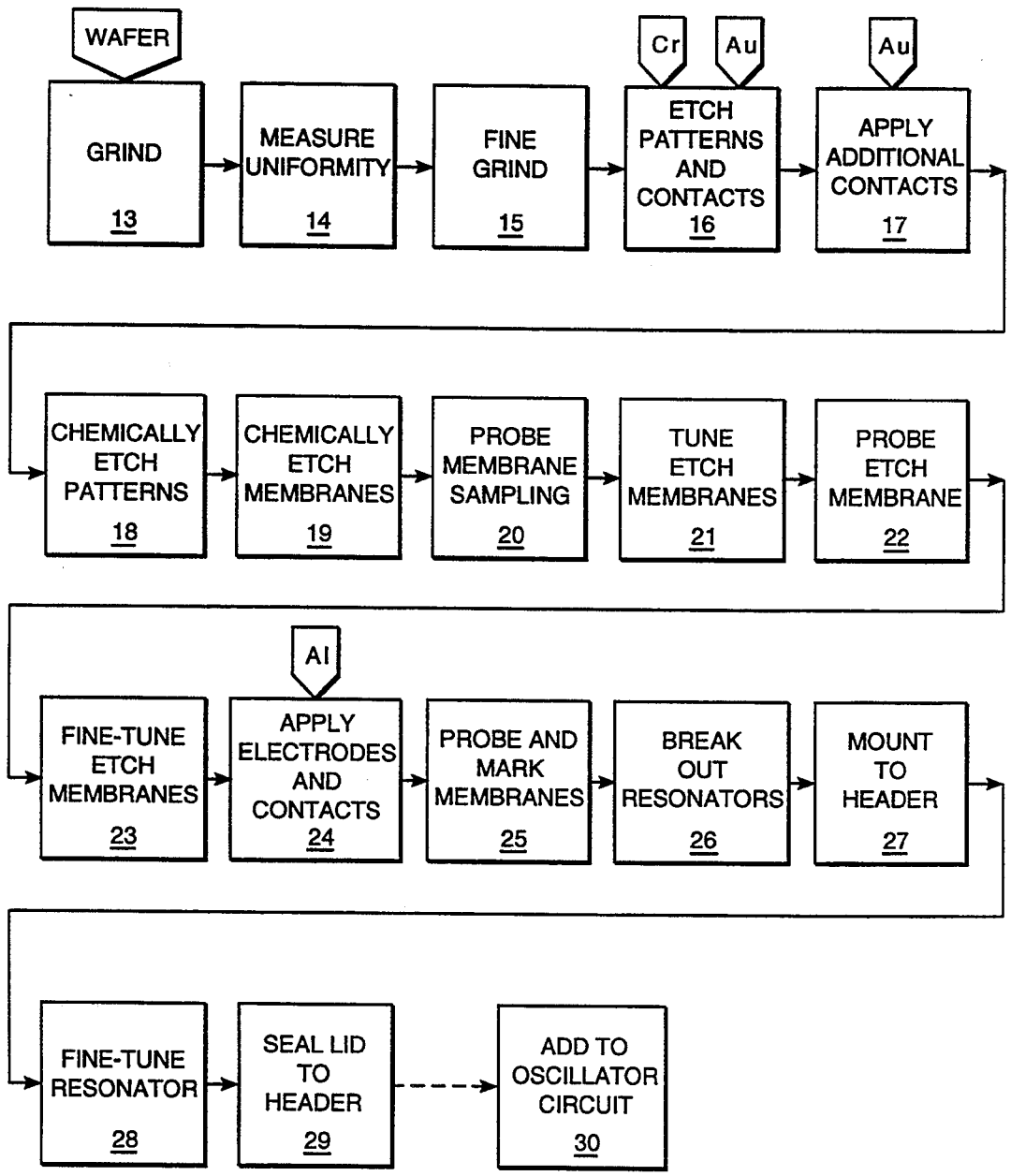
FIG_8

PROCESS FOR MASS PRODUCING HIGH FREQUENCY CRYSTAL RESONATORS

BACKGROUND OF THE INVENTION

This invention relates to crystal resonators and, more particularly, to a process for producing a plurality of high frequency crystal resonators of 30 MHz or greater.

Crystal resonators are used in a variety of timing dependent applications, such as in computers. Computers are capable of executing multiple tasks simultaneously. Yet such execution typically involves sharing buses, memory, and other common structures. Computers are therefore synchronized by a high frequency clock signal to maintain data integrity. Crystal resonators are used in computers to generate the clock signals for maintaining synchronous operations.

The crystal resonator is part of an oscillating circuit, The oscillator circuit generally comprises a piezoelectric crystal, a housing for protecting the crystal, and an amplifier-feedback loop combination capable of sustaining oscillation.

When a voltage is applied between certain faces of a piezoelectric crystal, a mechanical distortion is produced within the crystal. This phenomenon is known as the "piezoelectric effect". If the oscillator circuit provides an alternating current, the piezoelectric crystal is excited to a vibrating state at the frequency of the resonating circuit. When the oscillator circuit is energized, electrical noise will begin to excite the crystal at its natural resonant frequency. The crystal's output is then amplified and the amplified signal is fed back to the crystal. This causes the amplified signal to build up in strength at the resonating frequency of the crystal, until saturation of the circuit elements causes the overall loop gain in the circuit to fall to unity. This signal is fed to the output terminal of the oscillator.

Although a variety of piezoelectric materials may be used for resonators, monocrystalline (single crystal) quartz offers certain advantages. Single crystal quartz has low internal mechanical loss when used as a vibrator. Another important feature of quartz is that its frequency of vibration is highly stable with changes in temperature and over long periods of time.

A resonator is formed from single crystal quartz by first cutting the quartz into slabs, grinding the slabs to a desired thickness by a lapping process, and then polishing the slab surfaces. The choice of cut is usually dictated by the range of operating frequencies and the temperature range required for a particular application. Resonators with particular oblique cuts, such as AT, SC or BT, display negligble frequency variation with changes in temperature and operate at high frequencies. These resonators are generally referred to as thickness shear resonators, and are useful for making high frequency resonators on the order of 30 MHz or greater. The resonant frequency is approximately inversely proportional to the thickness of the wafer in the area of the vibration, so higher frequency devices require thinner wafers.

Single crystal quartz must be ground down to a very thin membrane to enable high resonant frequencies. However, a thin membrane is a poor structure for attaching a resonator. It is therefore desirable to produce a resonator with both a vibrating membrane region and a thicker region, the latter region serving as a support structure for attachment purposes.

Such a structure is obtained by grinding the crystal down to the thickness of the support structure, then etching the crystal to form the membrane portion.

At least two problems arise in this process. First, the crystal must be ground and polished to a highly uniform surface topography to assure successful membrane etching. Second, the precise thickness of the resonating membrane requires high precision etching. It is desirable to be able to produce the resonator from a wafer of single crystal quartz. Until now, the grinding process has not provided a quartz crystal wafer with sufficient thickness uniformity suitable for the mass-production of crystal resonators from wafers. Second, the standard etching process lacks the precision required to mass-produce resonators on a wafer with consistent frequencies. The production of crystal resonators with both an etched membrane and a support structure consequently has necessitated grinding and etching each unit individually. This process is time-consuming and costly.

One such prior art crystal resonating structure used in high frequency resonators is an "inverted mesa structure". "Inverted mesa structure" is a term of art referring to crystal resonators with a thin central membrane completely surrounded by a thicker support structure. Electrodes deposited on the membrane cause it to vibrate.

Inverted mesa structures have at least one disadvantage in addition to high production cost. The oscillating wave traveling outward from the vibrating (electrode) region of the membrane must be diminished to a very low amplitude by the time it reaches the surrounding support structure. The membrane must therefore be large relative to the electrode area to avoid undesirable damping of the resonance. Additional area is needed for the thicker supporting region, placing a physical constraint on the minimum size of the resonator.

SUMMARY OF THE INVENTION

The invention is a process for mass-producing high frequency crystal resonators of 30 MHz or greater. The resonators utilize single crystal quartz resonating in a thickness shear mode, etched to form a thin membrane cantilevered from a thicker crystal support structure.

In contrast to inverted mesa structures, the support structure of the present invention does not surround the etched membrane. Rather, it borders only one side of the membrane and provides a base from which the membrane projects. Consequently, a smaller support structure enables smaller resonator dimensions than are possible with inverted mesa structures having similar sized membranes. Another major advantage of the cantilever arrangement of the invention is that it enables mounting to be relatively free from mechanical stress.

The method for making the present invention utilizes a high precision process similar to semiconductor chip fabrication, thus allowing the invention to be mass-produced while still achieving the precise dimensions required for high frequency applications. This method presents a distinct advantage over prior art, since single crystal quartz resonators do not have to be lapped and etched individually. In processing a plurality of resonators in a wafer, the cost per resonator unit is reduced.

Briefly, a slab of quartz suitable for high frequency applications is lapped and polished to form a smooth wafer of uniform thickness. A sequence of metalizing and etching steps then define a plurality of resonator patterns on the wafer face, each having a peninsular resonating membrane cantilevered from a thicker support structure attached to the wafer.

The membranes are then tuned to the correct resonating frequency and electrodes are applied. The resonators are tuned a second time, then broken out of the wafer and packaged in a housing.

Other features and advantages of the invention either will become apparent or will be described in connection with the following, more detailed description of a preferred embodiment of the invention.

BRIEF DESCRIPTION OF THE DRAWING

With reference to the accompanying drawing:

FIG. 1 is an exploded perspective view of a crystal resonator fabricated using the preferred method of the invention, having a U-shaped crystal support structure, a cantilevered resonating membrane, a sloped edge between the support structure and membrane, and conductive elements and electrodes on opposing sides of the resonator;

FIG. 2(a) is a top plan view of a quartz crystal prior to application of electrodes and having a U-shaped support structure with a sloped edge, and thin and thick layers of conductive elements (dashed lines indicate the placement of conductive elements on the opposing face);

FIG. 2(b) is a lateral side view corresponding to the top plan view of FIG. 2(a):

FIG. 2 (c) is a longitudinal side view corresponding to the top plan view of FIG. 2(a);

FIG. 3(a) is a top plan view of a quartz crystal after the application of electrodes and having a U-shaped support structure with a sloped edge, thin and thick layers of conductive elements, and two electrodes extending from the support structure to the membrane over the sloped edge. Dashed lines indicate the placement of conductive elements and an electrode on the opposing face;

FIG. 3(b) is a lateral side view corresponding to the top plan view of FIG. 3(a);

FIG. 3(c) is a longitudinal side view corresponding to the top plan view of FIG. 3(a);

FIG. 4 is a top plan view of a resonator having three electrodes (dashed lines indicate the placement of one electrode on the opposing face);

FIG. 5 is a top plan view of a plurality of crystals connected to the crystal wafer during the fabrication process and prior to breakout;

FIG. 6 is a cross-sectional view of a packaged crystal resonator;

FIG. 7 is a block diagram of a simple oscillator circuit having an amplifier and a feedback circuit including a crystal resonator; and FIG. 8 is a flow diagram summarizing the process described in a preferred embodiment of the invention.

DETAILED DESCRIPTION OF THE PREFERRED EMBODIMENT(S)

The following relatively detailed description is provided to satisfy the patent statutes. However, it will be appreciated by those skilled in the art that various changes and modifications can be made without departing from the invention. The following description is exemplary, rather than exhaustive.

FIG. 8 is a flow diagram of a preferred embodiment of the process. Reference to this flow diagram will be helpful in understanding the following.

Lapping and Polishing Step 13

A wafer of AT cut single crystal quartz is mounted to a smooth, highly uniform and flat surface such as glass. Grinding and polishing apparatus is used to lap and polish one face of the wafer.

The wafer is then flipped over and the opposing face lapped and polished to provide the wafer with its specified thickness dimension, corresponding to the desired thickness of the bases of the resonators being produced.

Metalize and Define Resonator Shapes 16

In a first metalization step, opposing sides of the wafer are coated with a thin layer of a conductive metal. In a preferred embodiment, gold and a chromium adhesion layer are applied to the wafer by evaporization. Gold displays good conductivity and favorable masking characteristics, although other conductive metals may be substituted without changing the nature of the invention. The presence of chromium improves the adhesion of the gold to the quartz crystal ($SiO_2$). The use of adhesion layers is well known and need not be disclosed in further detail.

The metal layer on the wafer is then etched to define a plurality of resonator shapes. In a preferred embodiment, a pattern of resonator shapes such as those represented in FIG. 5 is masked onto the wafer and metal etched using standard photolithographic techniques. FIG. 2(a) depicts one of the resonator shapes 1, which are generally rectangular and are oriented so that their shorter sides are parallel to the x-axis of the crystal. Alternatively, the resonator shapes are disposed so that their longer sides are parallel to the x-axis, but the former orientation provides slightly better definition of the mounts and edges of the resonator.

In the preferred embodiment, images of two thin gold contacts 4 and 4' are formed on both sides of each resonator on the region of the crystal that will eventually form the resonator support structure 3 by photolithographic techniques.

Applying Additional Gold

In one embodiment, a thicker layer of gold is plated onto the gold contacts at the posterior region of each resonator, forming two contact pads 5 and 5'. The contact pads are applied prior to chemical etching and provide rigidity and strength at the resonator's point of attachment to the wafer. This point of attachment can be observed in FIG. 5. The strengthening function of the contact pads 5 and 5' may not be necessary if etching technology improves. It should be understood that conductive metals other than gold may be used, and may be applied by methods other than plating without departing from the spirit of the invention.

Chemically Etching Shapes 18 and Membranes 19

Next, the wafer is chemically etched through the crystal to further define the resonator shapes. A chemical etch of the metal layer is performed to provide the image of the membrane of each resonator. A second quartz etch is then performed to carve out the membranes 2.

AT cut crystals have the tendency to form slanted angles during chemical etching. Where these angles are acute or right, continuous metalization from one level of the crystal to the next becomes difficult. It is therefore desirable to shape the aforementioned support structure so that at least one edge on each face between the membrane and support structure will always be obtuse. In a preferred embodiment, the support structure 3 resulting from the chemical etching step 19 is U-shaped. In this U-shaped configuration, the crystal forms slopes 6 and 6' on the inside edges of the U-shaped support structure 3. These edges 6 and 6' each provide a gradual slope between the support structure 3 and the membrane 2, thus facilitating metalization later in the process. Shapes other than the U-shape may be used which result in at least one sloped edge on each side of the resonator between the support structure and the membrane, such as a rounded or V-shape. Chemical etching techniques are well-known and need not be described further.

Probing Membrane Sampling 20 and Tune Etching 21

After the membranes 2 are formed, the wafer is probed to obtain a sampling of membrane resonating frequencies across the wafer. In the preferred embodiment membranes are sampled with a probe arrangement to obtain a range of frequencies representative of the wafer. If the range of frequencies falls below the desired frequency, the wafer is further etched 21 to reduce membrane thicknesses.

Probe Etching Each Membrane 22

Slight nonuniformities in wafer thickness may result in frequency variations across the wafer. To correct this variation, each resonator membrane is probed and its frequency measured. An etching time is then calculated for each resonator based upon the difference between its measured frequency and the desired frequency. The etching time corresponds to the time required to further etch the membrane to the desired frequency, and will depend on the etching solution used. A person skilled in the art would possess the knowledge to perform such a calculation.

Fine-Tune Etching Membranes 23

Once etching times have been calculated and stored for each resonator, a fine-tuning etch is performed. In the preferred embodiment, etching solution is first applied to the resonator associated with the longest etching time, next to the resonator associated with the second-longest etching time, and so forth until etching solution has been applied to all resonators in need of further etching. By this process, each resonator will be etched for a time proportional to its deviation from the desired frequency, resulting in greater uniformity of frequencies across the wafer.

Applying Electrodes and contacts 24

Once fine-tune etching is complete, resonating means are applied to each resonator. In the preferred embodiment, another coating of thin gold with a chromium adhesion layer is applied to the resonator extending from the U-shaped support structure 3 to the membrane 2 over the sloped edges 6 and 6'. This gold-chromium layer forms a contact 13 coupling one of the pads 4 on one side of the resonator to a corresponding gold pad 4' on the opposing side. Aluminum electrodes 7 and 7' are then applied to opposing sides of the resonator. They are applied overlapping the gold-chromium using standard masking and etching techniques well-known to artisans. Other means of applying the electrodes may be used, and other conductive materials may be substituted for the aluminum. Furthermore, it should be understood that resonating means other than a pair of electrodes may be used without changing the nature of the invention. For example, the resonator shown in FIG. 4 has two electrodes and 7' on one face, and a third electrode 7" on the opposing face. This type of electrode configuration would be used in monolithic crystal filter applications.

Probing and Marking Membranes 25

Once the resonating means have been applied, each crystal resonator is again probed to measure its resonating frequency with the resonating means in place. Resonators with frequencies and/or electrical parameters falling outside of an acceptable range are marked and later discarded.

Breaking Out Resonators 26 and Mounting to Header 27

The unmarked crystal resonators are broken out of the wafer and packaged as depicted in FIG. 6. First, each resonator is mounted to a header 8. Lead terminals 9 from the header are coupled to the resonating means 7 by conductive epoxy or other coupling means.

Fine-Tuning Resonator 28

A final frequency measurement is made for each mounted resonator and fine-tuning is performed by mass loading the resonator, an evaporated metal for example.

Sealing Lid to Header 29

After fine-tuning the crystal is then encapsulated by a lid sealed to the header. In a preferred embodiment, the crystal resonator is covered with a cylindrical cap 10 hermetically sealed to the header. The container provides protection to the crystal from moisture and contamination. Methods for mounting and sealing crystal oscillators are well-known in the art and need not be discussed in detail.

Adding to Oscillator Circuit 30

The packaged resonator is then incorporated into an oscillator circuit (FIG. 7), including an amplifier 11 to amplify the oscillating waveform generated by crystal, and a feedback circuit 12 for feeding a portion of the amplifier output back through the resonator and into the amplifier input until the amplifier amplitude has stabilized.

As mentioned at the beginning of the detailed description, applicant is not limited to the specific embodiment(s) described above. Various changes and modifications can be made. The claims, their equivalents and their equivalent language define the scope of protection.

What is claimed is:

1. In a process for producing a plurality of high frequency crystal resonators from a resonating material, the step of:
    etching the resonating material to form a cantilevered resonating membrane on a region of each resonator bordered by at least one thicker support structure.
2. The process of claim 1 further comprising before said step, the steps of:
    mounting a wafer of resonating material to a flat surface; and thereafter
    lapping and polishing the wafer to uniform thickness.
3. The process of claim 1 further including:
    measuring each resonator to determine its frequency;

identifying resonators with frequencies falling within a predetermined acceptable frequency range; and breaking the resonators having frequencies within said range out of the wafer.

4. The process of claim 1 wherein the resonating material is single crystal quartz cut in a crystallographic orientation which enhances thickness shear modes of resonance.

5. The process of claim 2 further including the steps of coating the wafer with conductive metal and etching the conductive metal to define a plurality of resonator patterns and etching the resonating material along said patterns to define a plurality of resonators.

6. The process of claim 5 wherein said conductive material is gold.

7. The process of claim 1, wherein the step of etching the resonating material to form a resonating membrane further comprises shaping the support structure so that at least one edge between the support structure and the resonating membrane is sloped.

8. The process of claim 7, further comprising shaping the support structure in a U-shape so that the resonating membrane is cantilevered at the open end of the U and at least one edge between the support structure and the resonating membrane is sloped.

9. The process of claim 7, further comprising applying on each resonator a pair of electrodes respectively on opposing sides of the resonator, each electrode extending from the support structure to the resonating membrane over a sloped edge.

10. The process of claim 2 wherein mounting the resonating material to a flat surface comprises mounting the resonating material to a highly polished glass surface.

11. In a process for producing a plurality of high frequency crystal resonators, the steps of:

defining a plurality of resonators having resonator membranes on a wafer of resonating material;

probing each resonating membrane to measure its frequency;

determining the deviation of the measured frequency from a desired frequency;

calculating an etching time for each resonator from the measured deviation; and etching each membrane for the calculated etching time to fine-tune its frequency to the desired frequency, thereby increasing the uniformity of frequencies of resonators defined within the wafer.

12. The process of claim 11 further comprising:

grinding a wafer of resonating material to uniform thickness;

coating the wafer with conductive metal and etching the conductive metal to define a plurality of resonator patterns;

etching the resonating material along the resonator patterns to define a plurality of resonators;

etching the resonating material to carve a resonating membrane on a region of each resonator bordered by at least one thicker support structure;

applying resonating means to each resonator;

measuring each resonator to determine its membrane-plus-resonating-means frequency;

identifying resonators with frequencies falling within a predetermined acceptable frequency range; and breaking the resonators having frequencies within said range out of the wafer.

13. The process claim 12 including the further step of:

fine-tuning each resonator by mass loading the membrane with additional material.

14. The process of claim 11 wherein the resonating material is quartz crystal.

15. The process of claim 12, wherein the step of etching the resonating material to carve out a resonating membrane further comprises shaping the support structure so that at least one edge between the support structure and the resonating membrane is sloped.

16. The process of claim 15, further comprising shaping the support structure in a U-shape so that the resonating membrane is cantilevered at the open end of the U and at least one edge between the support structure and the resonating membrane is sloped.

17. The process of claim 15, further comprising applying on each resonator a pair of electrodes respectively on opposing sides of the resonator, each electrode extending from the support structure to the resonating membrane over a sloped edge.

18. In a process for producing a plurality of high frequency crystal resonators, the steps of:

grinding a wafer of resonating material to uniform thickness;

measuring the wafer to detect nonuniformities in thickness, then fine-grinding the wafer to correct for detected nonuniformities;

coating the wafer with conductive metal and etching the conductive metal to define a plurality of resonator patterns;

etching the resonating material along the resonator patterns to define a plurality of resonators;

etching the resonating material to carve on each resonator a resonating membrane cantilevered from a thicker support structure;

probing each resonator membrane to measure its frequency and to determine the deviation of the measured frequency from a desired frequency;

calculating an etching time for each resonator from the determined deviation;

etching each membrane for the calculated etching time to fine-tune its frequency to the desired frequency, thereby increasing the uniformity of frequencies resonators defined within the wafer;

applying resonating means to each resonator;

measuring each resonator to determine its frequency;

identifying resonators having frequencies falling within a predetermined acceptable frequency range; and breaking the resonators out of the wafer.

19. The process of claim 18 wherein the resonating material is single crystal quartz.

20. The process of claim 18 wherein the steps of coating the wafer with conductive metal and etching the conductive metal to define a plurality of resonator patterns comprise coating the wafer with gold and etching the gold to define a plurality of resonator patterns.

21. The process of claim 20 further comprising applying an adhesion layer in combination with the gold, thereby improving the adhesion of gold to the resonating material.

22. The process of claim 12 wherein the step of etching the resonating material along the resonator patterns to define a plurality of resonators comprises chemically etching the resonating material.

23. The process of claim 18 wherein the step of etching the resonating material to carve out a resonating membrane comprises chemically etching the resonating material.

24. The process of claim 18, wherein the step of etching the resonating material to carve out a resonating membrane further comprises shaping the support structure so that at least one edge between the support structure and the resonating membrane is sloped.

25. The process of claim 24, further comprising shaping the support structure in a U-shape so that the resonating membrane is cantilevered at the open end of the U and at least one edge between the support structure and the resonating membrane is sloped.

26. The process of claim 24, further comprising applying a pair of electrodes respectively on opposing sides of each resonator, each electrode extending from the support structure to the resonating membrane over a sloped edge.

* * * * *